United States Patent [19]

Ghiringhelli et al.

[11] 4,157,513

[45] Jun. 5, 1979

[54] PROTECTIVE SYSTEM FOR POWER STAGE OF MONOLITHIC CIRCUITRY

[75] Inventors: Giovanni Ghiringhelli, Segrate; Bruno Murari, Monza, both of Italy

[73] Assignee: SGS-ATES Componenti Elettronici S.p.A., Agrate Brianza, Milan, Italy

[21] Appl. No.: 862,355

[22] Filed: Dec. 20, 1977

[30] Foreign Application Priority Data

Dec. 21, 1976 [IT] Italy ............................... 30659 A/76

[51] Int. Cl.² ................................................ H03F 3/04
[52] U.S. Cl. ............................. 330/298; 330/143; 330/207 P; 330/289; 330/307; 361/96; 361/97
[58] Field of Search ................ 323/9; 330/207 P, 289, 330/298, 143; 361/96, 97, 98

[56] References Cited

U.S. PATENT DOCUMENTS

| | | | |
|---|---|---|---|
| 3,258,606 | 6/1966 | Meadows | 330/289 X |
| 3,393,328 | 7/1968 | Meadows et al. | 330/289 X |
| 3,792,316 | 2/1974 | Bondini et al. | 323/9 |
| 3,809,928 | 5/1974 | Evans | 330/143 X |
| 4,074,334 | 2/1978 | D'Arrigo et al. | 330/298 X |

*Primary Examiner*—Lawrence J. Dahl
*Attorney, Agent, or Firm*—Karl F. Ross

[57] ABSTRACT

A power transistor in the final stage of an IC amplifier feeding a reactive load, such as a loudspeaker, has an emitter resistor connected across the input of a monitoring transistor by way of a diode, the monitoring transistor being part of a protective circuit which reduces the input signal to the power amplifier in the event of an overload. To retard the response of the protective circuit, for the purpose of preventing signal distortions in the event of brief power surges, the diode and the monitoring transistor are so disposed on the silicon chip of the amplifier that a thermal wave from the overheating power transistor will first strike the diode, thereby reducing its resistance to compensate for an increased voltage drop across the emitter resistor, and will reach the monitoring transistor with a certain delay; if the overload persists, the resulting increase in the conductivity of the monitoring transistor re-establishes the full sensitivity of the protective circuit.

4 Claims, 6 Drawing Figures

PROTECTIVE SYSTEM FOR POWER STAGE OF MONOLITHIC CIRCUITRY

FIELD OF THE INVENTION

Our present invention relates to a protective system for a power element, such as a final amplifier stage, forming part of a monolithic integrated circuit such as a silicon chip.

BACKGROUND OF THE INVENTION

In commonly owned U.S. Pat. No. 3,792,316 there has been disclosed and claimed a system of this type wherein a power transistor coacts with a protective circuit including a monitoring transistor connected across a resistance in an emitter lead of the power transistor. The collector/emitter path of the latter transistor is shunted by a voltage divider consisting of a resistor in series with a diode, the latter being connected in bucking relationship with the base/emitter path of the monitoring transistor. The monitoring transistor controls a switching transistor forming a bypass for signals fed to the power transistor whenever the collector current $I_c$ and the collector/emitter voltage $V_{CE}$ fall outside a predetermined safety area. This arrangement prevents the flow of excessive load currents (e.g. in the case of a short circuit) which could damage or destroy the final stage of the amplifier.

The response of such a protective circuit is virtually instantaneous. This, however, is not always desirable. With a purely or predominantly reactive load, e.g. a loudspeaker, the number of volt-amperes in the final stage may safely reach short-term values amounting to five or more times the maximum power that can be tolerated with purely resistive loads. On the other hand, a sharp reduction of the output current in the presence of a brief overload not only leads to signal distortions, which may involve the generation of jarring noises in audio transmission, but may also result in the emission of high-frequency transients interfering with electronic equipment close by.

In order to avoid these inconveniences, it has already been proposed to provide means in such integrated circuitry to retard the response of the protective device or system by a delay on the order of one millisecond, sufficient to outlast peak amplitudes which in the case of audio signals endure only for intervals on the order of tens of microseconds. Such conventional delay means may take the form of a supplemental condenser which, because of its high capacitance (on the order of tenths of microfarads), cannot be incorporated in the integrated circuit and thus constitutes a separate component, requiring additional terminal areas on the IC chip and associated binding posts on its container whereby both the costs and the dimensions of the unit are increased.

OBJECT OF THE INVENTION

The object of our present invention, therefore, is to provide improved protective means for a power element of an integrated-circuit chip responding with a predetermined delay to an overload condition without the need for extraneous circuit elements.

SUMMARY OF THE INVENTION

We realize this object, in conformity with our present invention, by providing a semiconductive power-sensing component and a semiconductive compensating component of the protective circuit with heat-responsive conduction characteristics and disposing these components at different distances from the power element to be monitored whereby a thermal wave emanating from that element in an overheating condition reaches these components at different times. The component closer to the power element is so connected in the circuit as to reduce its sensitivity when the thermal wave strikes it, the other component being so connected as to increase that sensitivity upon being hit by the thermal wave whereby overloads lasting for periods less than the transit time of the thermal wave between these two components are ineffectual to limit the flow of current in the monitored element to be protected.

According to a more specific feature of our invention, the closer heat-sensitive component is a diode connected, as in U.S. Pat. No. 3,792,316, in bucking relationship with the base/emitter path of a monitoring transistor serving as the more remote power-sensing component.

BRIEF DESCRIPTION OF THE DRAWING

The above and other features of our invention will now be described in detail with reference to the accompanying drawing in which.

SPECIFIC DESCRIPTION

Figure 1:
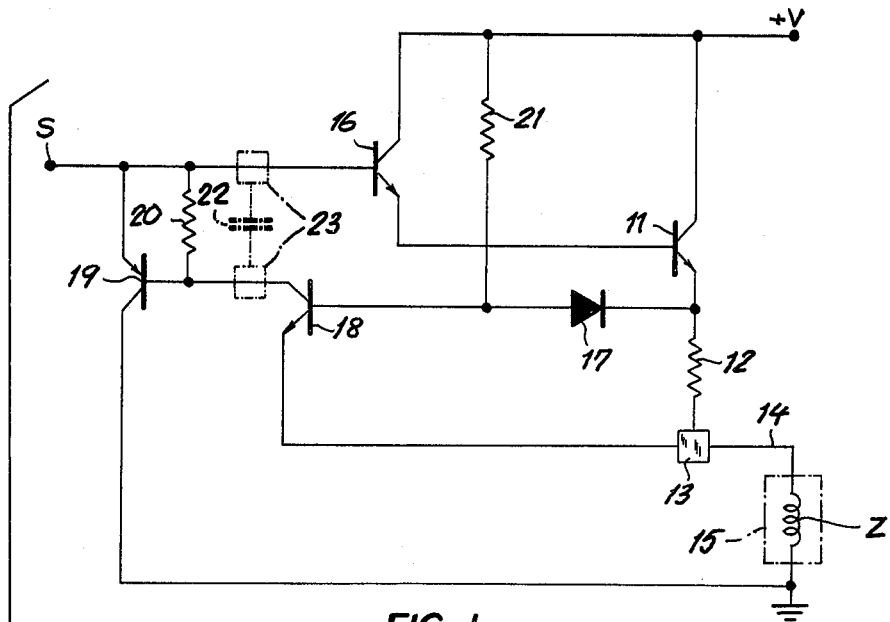
FIG. 1 is a circuit diagram of the final stage of an IC amplifier provided with a conventional delayed-response protective circuit.

In FIG. 1 we have shown the final stage of an integrated-circuit amplifier generally similar to that described in U.S. Pat. No. 3,792,316; reference may also be made to commonly owned application Ser. No. 724,463 filed Sept. 17, 1976 by one of us, Giovanni Ghiringhelli, together with another, now U.S. Pat. No. 4,074,334.

The system shown in FIG. 1 comprises a power transistor 11 of NPN type driven in a Darlington configuration by an NPN pilot transistor 16, the collectors of the two transistors being tied to a source of positive potential +V. Power transistor 11 has its emitter connected through a low-ohmic resistor 12, which has a magnitude of several tens of a milliohms and may be a metallized strip of the semiconductive substrate supporting the integrated circuitry, to a metallized junction 13 connected to an output terminal 14. Junction 13 and terminal 14 are grounded via a predominantly inductive load 15 comprising, for example, a loudspeaker coil Z.

A resistor 21 extends from terminal +V to a junction between the anode of a diode 17 and the base of an NPN monitoring transistor 18 whose emitter is tied to junction 13 and whose collector is connected to the base of a PNP switching transistor 19 having a grounded collector and an emitter tied to a signal-input terminal S. The emitter and the base of transistor 19 are bridged by a biasing resistor 20. Terminal S is directly connected to the base of pilot transistor 16 and is energized through a nonillustrated input impedance so that conduction of the normally nonconductive switching transistor 19 reduces the signal energy available at pilot stage 16.

Figure 2:
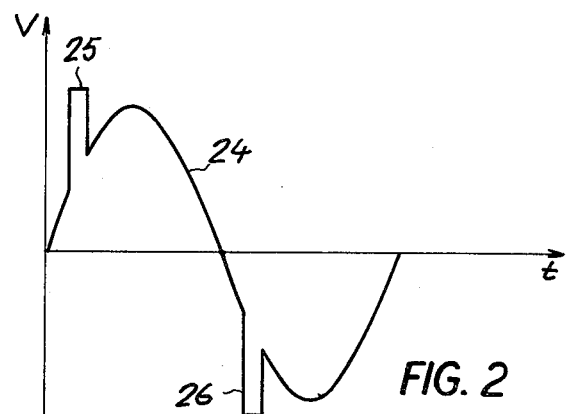
FIG. 2 is a graph showing the distortion of a signal in the system of FIG. 1.

The system of FIG. 1 operates essentially in the manner described in the above-identified prior patent, responding to a certain diminution of the current drawn through diode 17 and resistor 12 by conduction of monitoring transistor 18 in tandem with switching transistor 19 whereby the signal amplitude at the base of pilot transistor 16 is lowered; the point of conduction of transistor 19 depends on the magnitude of resistor 20. With a purely resistive load, an instantaneous response of this protective circuit will be satisfactory. With a purely or predominantly reactive load, however, a retardation of the response will be desirable for the reasons already indicated. In such a case it is conventional practice to connect a large external capacitor 22, as discussed above, across the biasing resistor 20 with the aid of additional metallized junctions 23 as indicated in phantom lines. Without such a capacitor, a sinusoidal voltage wave 24 illustrated in FIG. 2 with peaks surpassing the critical level would be subjected to distortion and would give rise to high-frequency transients such as spikes 25, 26.

Figure 3A:
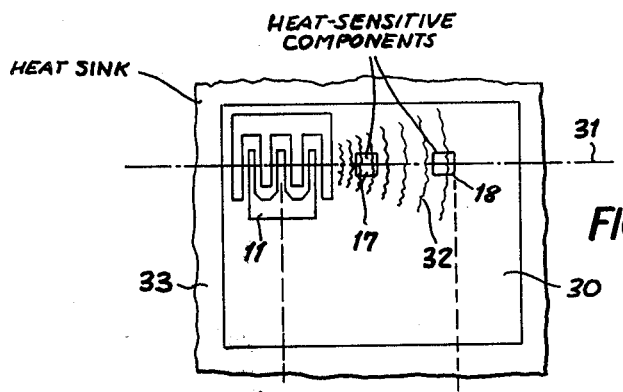
FIG. 3A is a more detailed diagram of part of the system of FIG. 1 modified in conformity with our present improvement.

As already pointed out, the provision of the external capacitance 22 is cumbersome and expensive. Therefore, in accordance with our present invention, we utilize a thermal wave 32 emanating in the case of overload from power transistor 11 (see FIG. 3A) to first reduce and then restore the sensitivity of the protective circuit including transistors 18 and 19. Diode 17 and monitoring transistor 18 are heat-sensitive components and are disposed at different distances, along a line 31, from transistor 11 so that thermal wave 32 strikes first the diode and then the monitoring transistor. FIG. 3A also shows a silicon chip 30 serving as the semiconductive substrate, resting on a metallic heat sink 33 such as a copper block as is well known per se. The other constituents of the system, i.e. the remaining elements shown in full lines in FIG. 1 plus nonillustrated earlier amplifier stages, are also incorporated in chip 30 but have not been depicted in FIG. 3A.

Upon the occurrence of an overload, diode 17 heats up almost as fast as power transistor 11. This reduces its forward resistance so that the voltage drop across the diode is diminished to compensate the increased voltage drop across emitter resistor 12. Thus, monitoring transistor 18 remains cut off until it, too, is affected by the rising temperature with resulting lowering of its conduction threshold and activation of switching transistor 19. If, in the interim, the power peak has passed, transistors 18 and 19 remain nonconductive so as to leave unaffected the output current traversing the load 15.

In practice, a transit time of 1 millisecond for the propagation of thermal wave 32 through chip 30 from transistor 11 to transistor 18 requires a spacing therebetween of about twice the chip thickness which may be approximately 0.2 mm. The area of chip 30 shown in FIG. 3A may be about $2 \times 2.5$ mm$^2$.

Figure 3B:
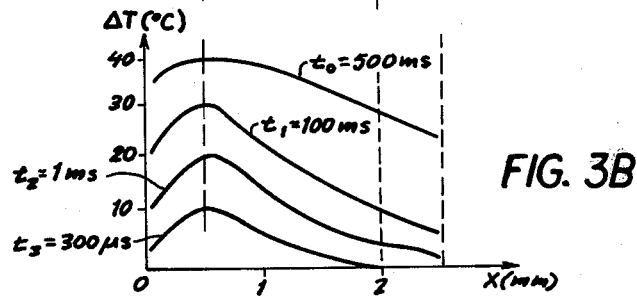
FIG. 3B is a graph serving to explain the operation of our present system.
Figure 4:
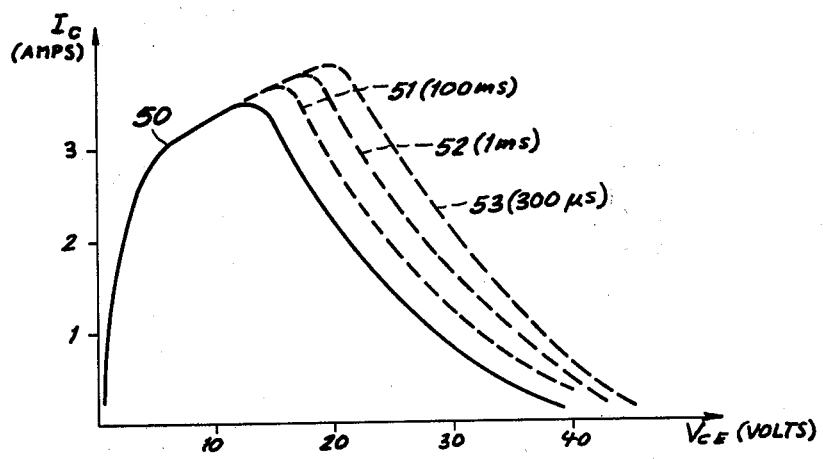
FIG. 4 is a current/voltage diagram for the final amplifier stage in a system of the type shown in FIG. 1.

FIG. 3B shows the progression of the thermal wave along line 31 of FIG. 3A when transistor 11 heats up above the steady-state operating temperature maintained by heat sink 33. Curves $t_3$, $t_2$, $t_1$, $t_0$ represent temperature increments $\Delta T$ (in °C.) occurring at various points of distance x (in millimeters), measured from one of the chip edges, at respective instants occurring 0.3 ms, 1 ms, 100 ms and 500 ms after the incipient overload. In FIG. 4, where the collector current $I_c$ of transistor 11 has been plotted against its collector/emitter voltage $V_{CE}$ sensed by voltage divider 21, 17, curve 50 represents the normal safe-operation area whereas curves 51, 52 and 53 indicate the boundaries of that area for short-term overloads lasting for 100 ms, 1 ms and 300 μs, respectively. The protective circuit according to our invention goes into action as soon as these limits are exceeded in either time or volt-amperes.

Figure 5:
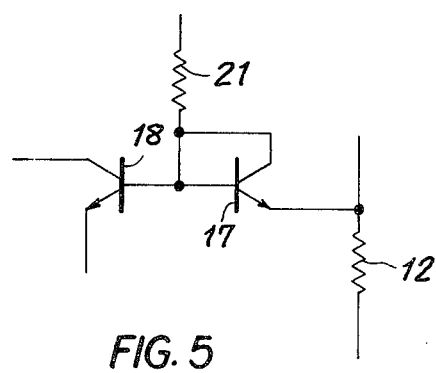
FIG. 5 shows a structural detail of the assembly diagrammatically represented in FIG. 3A.

FIG. 5 shows diode 17 as an NPN transistor with short-circuited collector and base tied to the base of monitoring transistor 18. This constitutes a well-known current-mirror circuit and ensures that, with the use of transistors of similar characteristics, their exposure to a given temperature rise will have substantially equal and opposite effects upon the protective system.

We claim:

1. In integrated circuitry including a power element connected across a load by way of a series resistor, and a normally inactive protective circuit comprising a diode and a monitoring transistor for limiting the current flow in said power element in response to excessive voltage drops across said series resistor, said monitoring transistor having a base and an emitter connected in bucking relationship with said diode across said series resistor, the improvement wherein said diode and said monitoring transistor are disposed at different distances from said power element for consecutively receiving a thermal wave emanating from said power element in an overheating condition thereof, said diode being connected to reduce the sensitivity of said protective circuit in response to said thermal wave whereas said monitoring transistor is connected to increase said sensitivity upon being struck by said thermal wave whereby only overloads lasting for periods at least equal to the transit time of the thermal wave between said components are fully effective to limit said current flow.

2. The improvement defined in claim 1 wherein said diode is a transistor with a base connected to its own collector and to the base of said monitoring transistor to form a current-mirror connection therewith.

3. The improvement defined in claim 1 wherein said power element, said diode and said monitoring transistor are disposed substantially in a straight line on a common semiconductor chip supported on a heat sink.

4. The improvement defined in claim 1 wherein said diode is disposed closer to said power element than said monitoring transistor.

* * * * *